US010573725B1

(12) United States Patent
Huang

(10) Patent No.: US 10,573,725 B1
(45) Date of Patent: Feb. 25, 2020

(54) SEMICONDUCTOR STRUCTURE AND MANUFACTURING METHOD THEREOF

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/137,236

(22) Filed: Sep. 20, 2018

(51) Int. Cl.
*H01L 23/52* (2006.01)
*H01L 29/66* (2006.01)
*H01L 23/532* (2006.01)
*H01L 21/768* (2006.01)
*H01L 21/3213* (2006.01)
*H01L 21/3205* (2006.01)

(52) U.S. Cl.
CPC ...... *H01L 29/665* (2013.01); *H01L 21/32053* (2013.01); *H01L 21/32055* (2013.01); *H01L 21/32134* (2013.01); *H01L 21/76804* (2013.01); *H01L 21/76847* (2013.01); *H01L 21/76864* (2013.01); *H01L 21/76865* (2013.01); *H01L 23/53209* (2013.01); *H01L 23/53257* (2013.01)

(58) Field of Classification Search
CPC ......... H01L 23/53209; H01L 23/53257; H01L 29/665
USPC ....................................................... 257/741
See application file for complete search history.

(56) References Cited

U.S. PATENT DOCUMENTS

| 8,153,490 | B2* | 4/2012 | Hsu | ...................... H01L 21/2652 438/270 |
| 8,569,816 | B2* | 10/2013 | Shroff | ............... H01L 29/66181 257/301 |
| 8,779,422 | B2* | 7/2014 | Lee | ................... H01L 27/10885 257/51 |
| 2008/0003792 | A1* | 1/2008 | Chae | ................. H01L 21/02071 438/592 |

FOREIGN PATENT DOCUMENTS

TW          201405808 A    2/2014

* cited by examiner

*Primary Examiner* — Luan C Thai
(74) *Attorney, Agent, or Firm* — Muncy, Geissler, Olds & Lowe, P.C.

(57) ABSTRACT

The present disclosure provides a semiconductor structure. The semiconductor structure includes a semiconductor substrate, a dielectric layer, and silicide layer. The semiconductor substrate has a plurality of protrusions. The dielectric layer is disposed over the semiconductor substrate and has a plurality of blocks disposed over the protrusions. The silicide layer is disposed over a first sidewall of the protrusions, a second sidewall of the blocks, and an upper surface of the semiconductor substrate adjacent to the first sidewall, and a bottom surface of the silicide layer is lower than a first surface of the semiconductor substrate. The present disclosure further provides a method for manufacturing the semiconductor structure.

20 Claims, 7 Drawing Sheets

SEMICONDUCTOR STRUCTURE AND MANUFACTURING METHOD THEREOF

TECHNICAL FIELD

The present disclosure relates to a semiconductor structure and a manufacturing method thereof.

DISCUSSION OF THE BACKGROUND

Electronic equipment using semiconductor devices is essential for many modern applications. With the advancement of electronic technology, the semiconductor devices are becoming increasingly smaller in size while having greater functionality and greater amounts of integrated circuitry. Fabrication of semiconductor devices typically involves placing numerous components over a semiconductor substrate.

When a landing contact hole is self-aligned to a control gate, with the tiny space of an active region, a silicide layer formed on the active region does not play a major role in reducing transistor serial resistance since there is no active area between the contact landing area and a transistor gate spacer. Therefore, there is a need to reduce transistor serial resistance in semiconductor devices.

SUMMARY

One aspect of the present disclosure provides a semiconductor structure. The semiconductor structure comprises a semiconductor substrate, a dielectric layer, and silicide layer. In some embodiments, the semiconductor substrate has a plurality of protrusions. The dielectric layer is disposed over the semiconductor substrate and has a plurality of blocks disposed over the protrusions. The silicide layer is disposed over a first sidewall of the protrusions, a second sidewall of the blocks, and an upper surface of the semiconductor substrate adjacent to the first sidewall. In some embodiments, a bottom surface of the silicide layer is lower than a first surface of the semiconductor substrate.

In some embodiments, the protrusion has a first bottom width and a first upper width less than the first bottom width, and the blocks have a second bottom width and a second upper width less than the second bottom width.

In some embodiments, the protrusions and the blocks disposed over the protrusions are arranged in a funnel configuration.

In some embodiments, a slope of the first sidewall and the second sidewall is consistent along a vertical direction.

In some embodiments, a thickness of the silicide layer disposed over the first sidewall and the second sidewall is substantially same as a thickness of the silicide disposed over the upper surface.

In some embodiments, a thickness of the silicide layer disposed over the first sidewall and the second sidewall is substantially greater than a thickness of the silicide disposed over the upper surface.

In some embodiments, a ratio of a thickness of the silicide layer disposed over the first sidewall and the second sidewall to a thickness of the upper surface is substantially less than 10:1.

In some embodiments, the ratio of the thickness of the silicide layer disposed over the first sidewall and the second sidewall to the thickness of the upper surface is substantially greater than 1:10.

In some embodiments, the thickness of the silicide layer over the first sidewall and the second sidewall is gradually decreased from a front surface of the dielectric layer towards the upper surface.

In some embodiments, a crystal phase of the silicide layer disposed over the upper surface is substantially same as a crystal phase of the silicide layer disposed over the first sidewall and the second sidewall.

Another aspect of the present disclosure provides a method for manufacturing a semiconductor structure. The method comprises providing a semiconductor substrate having a plurality of protrusions; disposing a dielectric layer having a plurality of blocks over the protrusions, respectively; disposing a liner over a first sidewall of the protrusions and a second sidewall of the blocks; disposing a metal layer over the liner, a front surface of the dielectric layer and an upper surface of the semiconductor substrate; performing a thermal process to at least make a portion of the metal layer react with the liner and the semiconductor substrate to form a silicide layer; and performing a wet etch process to remove an unreacted portion of the metal layer over a front surface of the dielectric layer.

In some embodiments, the step of forming the liner over the first sidewall of the protrusion and the second sidewall of the block comprises disposing the liner over a front surface of the dielectric layer away from the semiconductor substrate, the first sidewall, the second sidewall, and an upper surface of the semiconductor substrate adjacent to the first sidewall; and removing the liner over the front surface and the upper surface by etching.

In some embodiments, a thickness of the liner disposed over the first sidewall and the second sidewall is consistent along a vertical direction.

In some embodiments, the metal layer is further disposed over a front surface of the dielectric layer and the metal layer disposed over the front surface is removed after performing the thermal process.

In some embodiments, a ratio of a thickness of the metal layer disposed over the front surface to a thickness of the upper surface is substantially less than 100:1.

In some embodiments, the ratio of the thickness of the metal layer disposed over the front surface to the thickness of the upper surface is substantially greater than 2:1.

In some embodiments, a thickness of the metal layer disposed over the first sidewall and the second sidewall is consistent along a vertical direction.

In some embodiments, a thickness of the metal layer disposed over the first sidewall and the second sidewall is gradually decreased from a front surface of the dielectric layer away from the semiconductor substrate towards the upper surface.

In some embodiments, a bottom surface of the silicide layer interfaced with the semiconductor substrate is lower than a first surface of the semiconductor substrate interfaced with the dielectric layer.

Another aspect of the present disclosure provides a method for manufacturing a semiconductor structure. The method comprises providing a semiconductor substrate; disposing a dielectric layer over the semiconductor substrate; forming a plurality of recesses in the semiconductor substrate and a plurality of through holes in the dielectric layer, wherein the through holes are in communication with the recesses, respectively; disposing a liner over the semiconductor substrate exposed by the recesses and the dielectric layer exposed by the through holes; removing a portion of the liner disposed over a front surface of the dielectric layer; disposing a metal layer over the liner, a front surface of the dielectric layer and the upper surface of the semiconductor substrate; and performing a thermal process to make the metal layer react with the liner and the semiconductor substrate to form a silicide layer; and performing a wet etch process to remove an unreacted portion of the metal layer over a front surface of the dielectric layer.

With the above-mentioned configurations of a semiconductor structure and a method for manufacturing the semiconductor structure, the thermal process is performed to make a portion of the metal layer react with the semiconductor substrate in order to form the silicide layer. As a result, the transistor serial resistance is reduced.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
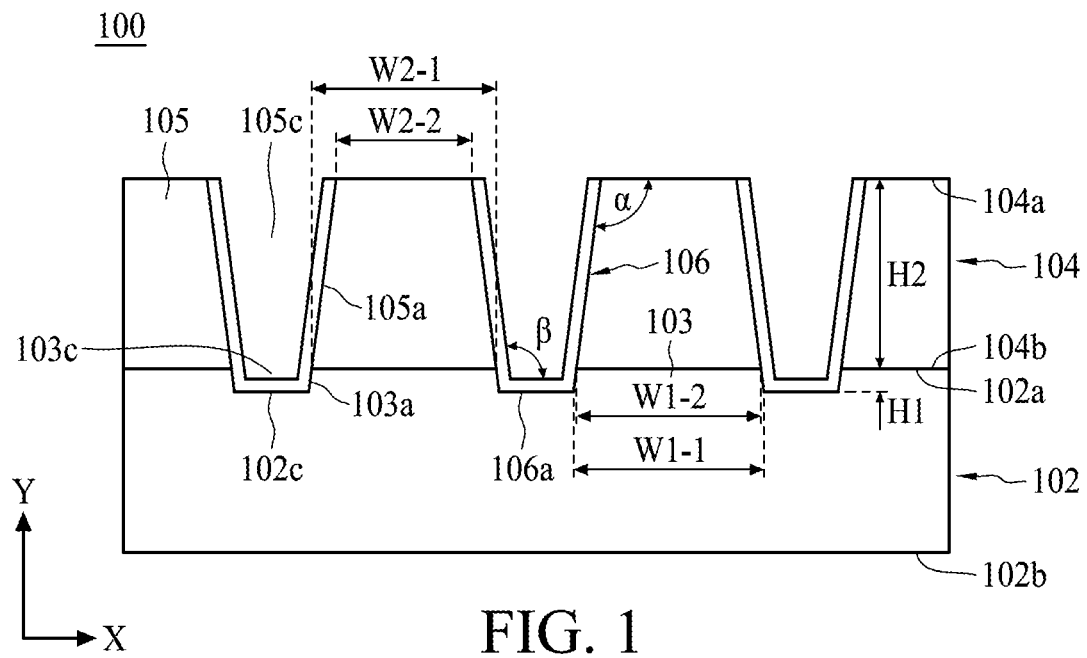
FIG. 1 is a schematic cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure in accordance with some embodiments of the present disclosure. Referring to FIG. 1, in some embodiments, the semiconductor structure 100 includes a semiconductor substrate 102 having a plurality of protrusions 103; a dielectric layer 104 disposed over the semiconductor substrate 102 and including a plurality of blocks 105 disposed over the protrusions 103, respectively; and a silicide layer 106 disposed over a first sidewall 103a of the protrusions 103, a second sidewall 105a of the block 105, and an upper surface 102c of the semiconductor substrate 102 neighboring the protrusions 103. A bottom surface 106a of the silicide layer 106 is lower than a first surface 102a of the semiconductor substrate 102.

In some embodiments, the semiconductor substrate 102 includes the first surface 102a and a second surface 102b opposite to the first surface 102a. In some embodiments, the first surface 102a is at a front side of the semiconductor substrate 102, and the second surface 102b is at a back side of the semiconductor substrate 102. In some embodiments, the upper surface 102c is substantially parallel to the first surface 102a or the second surface 102b. In some embodiments, the semiconductor substrate 102 is a silicon substrate or a silicon wafer.

In some embodiments, the protrusion 103 is in a funnel configuration. In some embodiments, the protrusion 103 has at least two different widths (W1-1, W1-2) along a vertical direction Y. In some embodiments, the protrusion 103 has a first bottom width W1-1 and a first upper width W1-2 different from the first bottom width W1-1, such that the protrusion 103 is tapered from the first surface 102a towards the second surface 102b. In some embodiments, the first upper width W1-2 is less than the first bottom width W1-1, or the first bottom width W1-1 is greater than the first upper width W1-2. In some embodiments, the width of the protrusion 103 is gradually increased from the first upper width W1-2 to the first bottom width W1-1 along the vertical direction Y.

In some embodiments, the first sidewall 103a extends from the first surface 102a toward the second surface 102b. In some embodiments, the first sidewall 103a is disposed at an angle β relative to the upper surface 102c of the semiconductor substrate 102 adjacent to the first sidewall 103a. In some embodiments, the angle β is substantially greater than 90 degrees.

In some embodiments, the dielectric layer 104 includes a front surface 104a and a back surface 104b opposite to the front surface 104a. In some embodiments, the back surface 104b of the dielectric layer 104 contacts the upper surface 102c of the semiconductor substrate 102. In some embodiments, the dielectric layer 104 includes oxide.

In some embodiments, the block 105 is in a funnel configuration. In some embodiments, the protrusion 103 has a first height H1 less than a second height H2 of the block 105 along the vertical direction Y. In some embodiments, the block 105 has at least two different widths (W2-1, W2-2) along the vertical direction Y. In some embodiments, the block 105 has a second bottom width W2-1 and a second upper width W2-2 different from the second bottom width W2-1, such that the block 105 is tapered from the front surface 104a towards back surface 104b. In some embodiments, the second upper width W2-2 is less than the second bottom width W2-1, or the second bottom width W2-1 is greater than the second upper width W2-2. In some embodiments, the width of the block 105 is gradually increased from the second upper width W2-2 to the second bottom width W2-1 along the vertical direction Y. In some embodiments, the second upper width W2-2 is less than the second bottom width W2-1, or the second bottom width W2-1 is greater than the second upper width W2-2. In some embodiments, the width of the block 105 is gradually increased from the second upper width W2-2 to the second bottom width W2-1 along the vertical direction Y.

In some embodiments, the second sidewall 105a extends from the front surface 104a toward the back surface 104b. In some embodiments, a slope of the first sidewall 103a and the second sidewall 105a is consistent along the vertical direction Y. In some embodiments, the second sidewall 105a is oriented at an angle α relative to the front surface 104a. In some embodiments, the angle α is substantially greater than 90 degrees.

In some embodiments, a thickness of the silicide layer 106 disposed over the second sidewall 105a of the block 105 and a thickness of the silicide layer 106 disposed over the first sidewall 103a of the protrusion 103 are consistent, and the thickness of the silicide layer 106 disposed over the first sidewall 103 of the protrusion 103 and a thickness of the silicide layer 106 disposed over the upper surface 102a of the semiconductor substrate 102 are consistent, as shown in FIG. 1.

Figure 2:
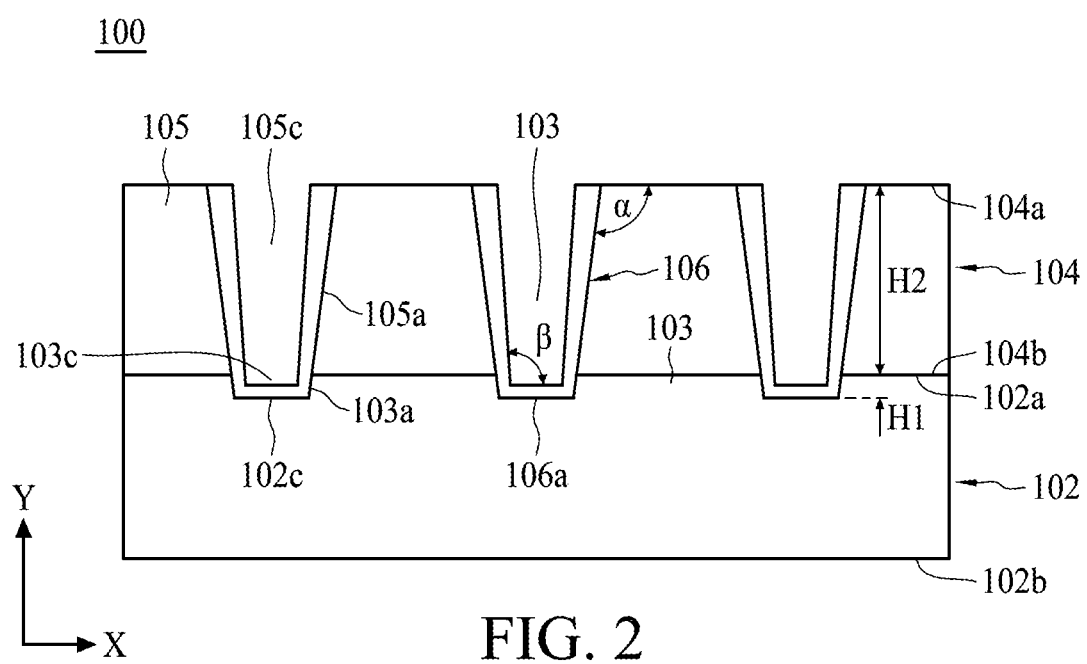
FIG. 2 is a schematic cross-sectional view of a semiconductor structure in accordance with some embodiments of the present disclosure.

In some embodiments, the thickness of the silicide layer 106 disposed over the second sidewall 105a of the block 105 is greater than the thickness of the silicide layer 106 disposed over the first sidewall 103a of the protrusion 103, and the thickness of the silicide layer 106 disposed over the first sidewall 103a of the protrusion 103 is greater than the thickness of the silicide layer 106 disposed over the upper surface 102a of the semiconductor substrate 102, as shown in FIG. 2. In some embodiments, the thickness of the silicide layer 106 disposed over the upper surface 102c of the semiconductor substrate 102 is consistent along a horizontal direction X.

In some embodiments, the ratio of the thickness of the silicide layer 106 over the first sidewall 103a of the protrusion 103 and the second sidewall 105a of the block 105 to that over the upper surface 102c of the semiconductor substrate 102 is substantially less than 10:1. In some embodiments, the ratio of the thickness of the silicide layer 106 over the first sidewall 103a of the protrusion 103 and the second sidewall 105a of the block 105 to that over the upper surface 102c of the semiconductor substrate 102 is substantially greater than 1:10. In some embodiments, the thickness of the silicide layer 106 disposed over the second sidewall 105a of the block 105 is gradually decreased from the front surface 104a towards the back surface 104b of the dielectric layer 103, and the thickness of the silicide layer 106 of the first sidewall 103a of the protrusion 103 is gradually decreased from the first surface 102a towards the second surface 102b of the semiconductor substrate 102.

Figure 3:
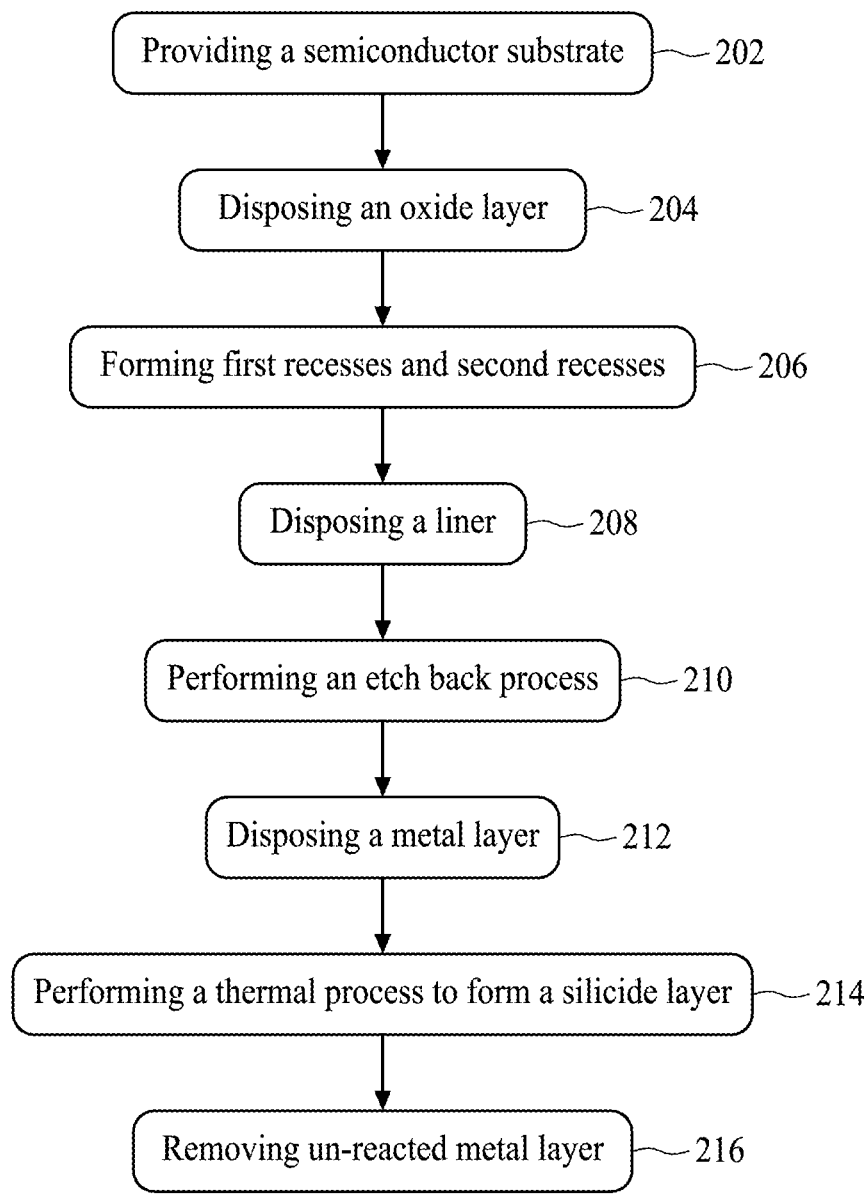
FIG. 3 is a flow diagram of a method of manufacturing a semiconductor structure in accordance with some embodiments of the present disclosure.

FIG. 3 is a flowchart showing a method 200 for manufacturing a semiconductor structure in accordance with some embodiments of the present disclosure. FIGS. 4A to 4I are schematic views of manufacturing a semiconductor structure by the method 200 in FIG. 3 in accordance with some embodiments of the present disclosure. In some embodiments, the method 200 includes a number of operations (202, 204, 206, 208, 210, 212, 214 and 216) and the description and illustration below are not deemed as a limitation as the sequence of the operations.

Figure 4A:
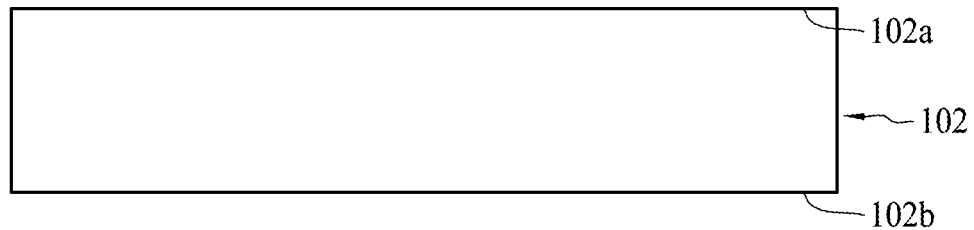
FIGS. 4A to 4I are schematic views of manufacturing a semiconductor structure by the method of FIG. 3 in accordance with some embodiments of the present disclosure.

In operation 202, a semiconductor substrate 102 is provided as shown in FIG. 4A. In some embodiments, the semiconductor substrate 102 is a silicon substrate or a silicon wafer. In some embodiments, the semiconductor substrate 102 includes a first surface 102a opposite to the second surface 102b.

Figure 4B:
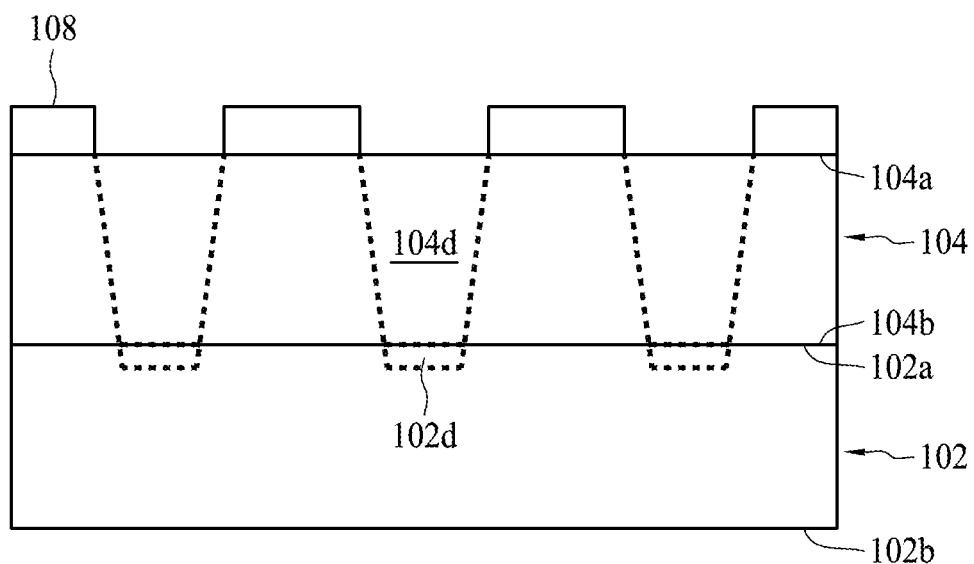
Figure 4C:
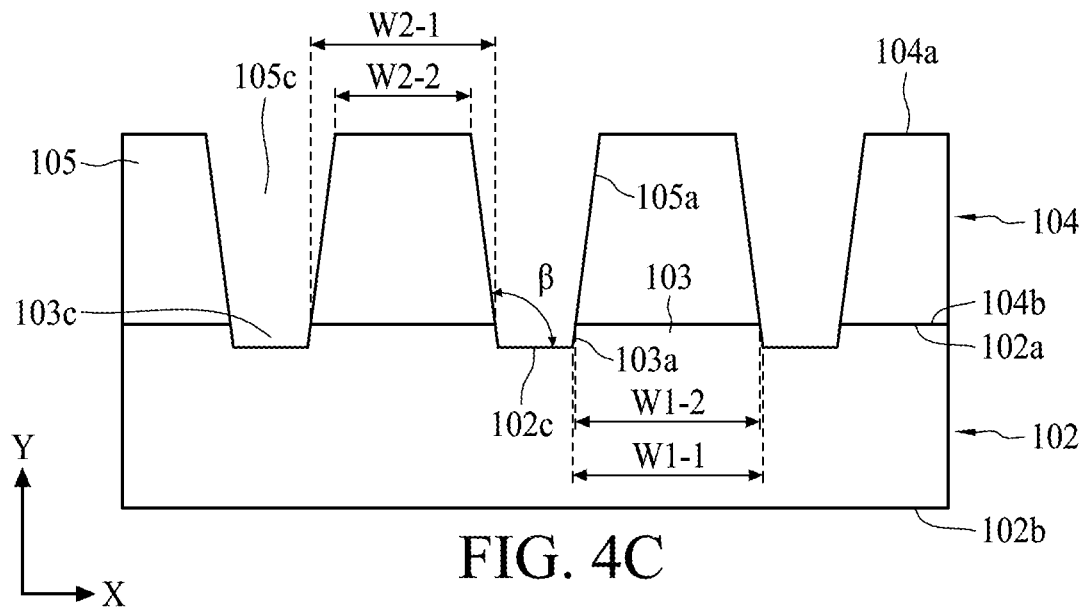

In operation 204, a dielectric layer 104 is disposed over the semiconductor substrate 102 as shown in FIG. 4B. In some embodiments, the dielectric layer 104 includes a front surface 104a and a back surface 104b opposite to the front surface 104a. In some embodiments, the back surface 104b is interfaced with the first surface 102a of the semiconductor substrate 102. In some embodiments, the dielectric layer 104 is formed over the semiconductor substrate 102 by suitable deposition operations such as chemical vapor deposition (CVD) or the like. In some embodiments, the dielectric layer 104 includes oxide.

After the deposition of the dielectric layer 104 over the semiconductor substrate 102, the dielectric layer 104 and the semiconductor substrate 102 are patterned by removing a predetermined portion of the dielectric layer 104 and the semiconductor substrate 102. In some embodiments, the dielectric layer 104 and the semiconductor substrate 102 are patterned by suitable operation such as photolithography, etching, or the like. In some embodiments, a patterned photoresist 108 is disposed over the dielectric layer 104, such that the predetermined portion of the dielectric layer 104 and the semiconductor substrate 102 are exposed through the patterned photoresist 108, and next the predetermined portions of the dielectric layer 104 and the semiconductor substrate 102 are removed by a suitable operation such as wet etching or the like. In some embodiments, one or more recesses 103c are formed by removing the first portion 102d of the semiconductor substrate 102, thereby also forming a plurality of protrusions 103; and one or more through holes 105c in communication with the recesses 103c are formed by removing the second portion 104d of the dielectric layer 104, thus forming a plurality of blocks 105, as shown in FIG. 4B.

In some embodiments, the protrusion 103 includes a first sidewall 103a and the semiconductor substrate 102 has an upper surface 102c adjacent to the first sidewall 103a. In some embodiments, the first sidewall 103a is disposed at an angle 3 being substantially greater than 90 degrees relative to the upper surface 102c. In some embodiments, the first sidewall 103a is a tapered and sloped sidewall tapering from the first surface 102a into the semiconductor substrate 102. In some embodiments, the upper surface 102c is substantially parallel to the first surface 102a or the second surface 102b of the semiconductor substrate 102.

In some embodiments, the protrusion 103 includes a first bottom width W1-1 and a first upper width W1-2 substantially less than the first bottom width W1-1 as shown in FIG.

3C, and the block 105 includes a second bottom width W2-1 and a second upper width W2-2 substantially less than the second bottom width W2-1.

In some embodiments, the second sidewall 105a is a tapered and sloped sidewall tapering from the front surface 104a of the dielectric layer 104 through the back surface 104b of the dielectric layer 104. In some embodiments, a slope of the first sidewall 103a and the second sidewall 105a is consistent along the vertical direction.

Figure 4D:
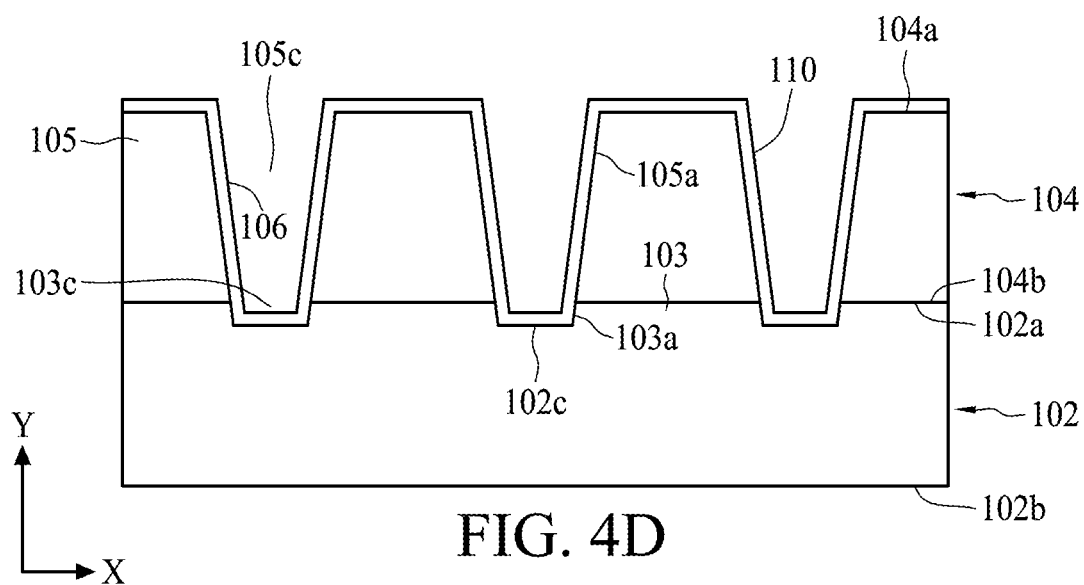

In operation 208, a liner 110 is disposed over the semiconductor substrate 102 exposed by the recesses 103c and the dielectric layer 104 exposed by the through holes 105c. In some embodiments, the liner 110 is disposed over the front surface 104a of the dielectric layer 104, the second sidewalls 105a of the block 105, the first sidewalls 103a of the protrusions 103, and the upper surfaces 102c of the semiconductor substrate 102 as shown in FIG. 4D by a suitable deposition operation. In some embodiments, a thickness of the liner 110 disposed over the front surface 104a of the dielectric layer 104, the second sidewall 105a of the block 105, the first sidewall 103a of the protrusion 103, and the upper surface 102a of the semiconductor substrate 102 is consistent. In some embodiments, the liner is selected from polysilicon (poly-Si) or amorphous silicon (a-Si).

Figure 4E:
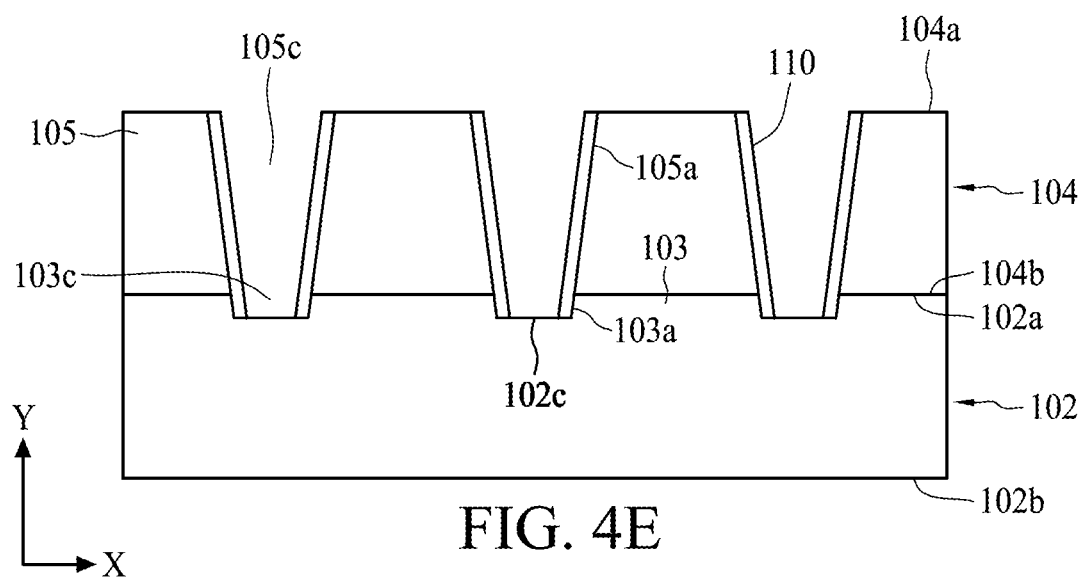

In operation 210, an etch back process is performed to remove a portion of the liner 110. After the deposition of the liner 110, a portion of the liner 110 disposed over the front surface 104a of the dielectric layer 104 and the upper surface 102c of the semiconductor substrate 102 are removed by the etch back process as shown in FIG. 4E. In some embodiments, the liner 110 disposed over the front surface 104a of the dielectric layer 104 and the upper surfaces 102c of the semiconductor substrate 102 is completely removed, while the liner 110 disposed over the first sidewall 103a of the protrusions 103 and the second sidewall 105a of the block 105 remains in place. As such, the first sidewall 103a of the protrusions 103 and the second sidewall 105a of the block 105 are still covered by the liner 110, while the front surface 104a of the dielectric layer 104 and the upper surface 102c of the semiconductor substrate 102 are exposed through the liner 110.

Figure 4F:
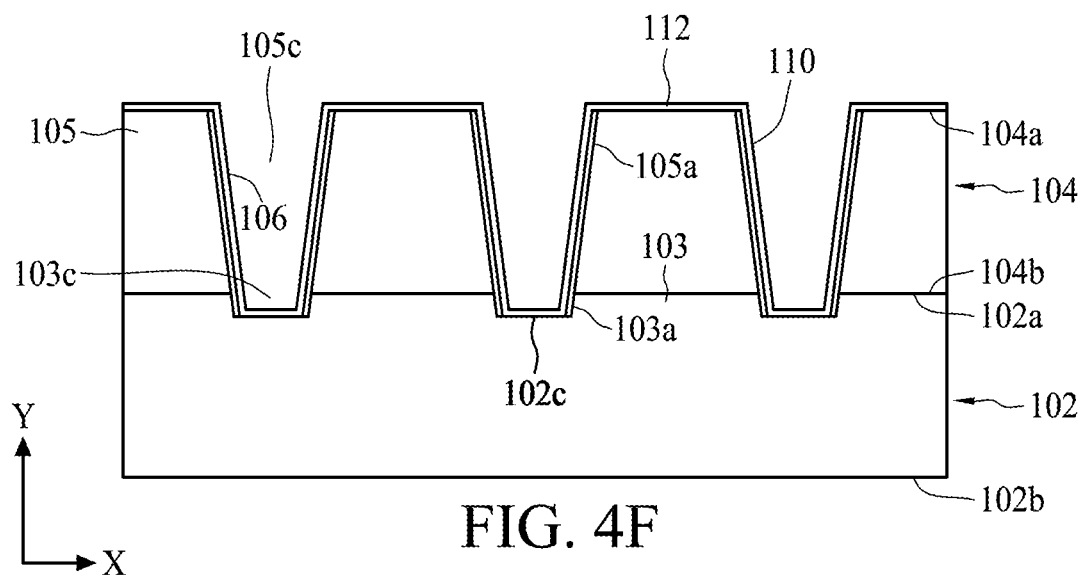
Figure 4G:
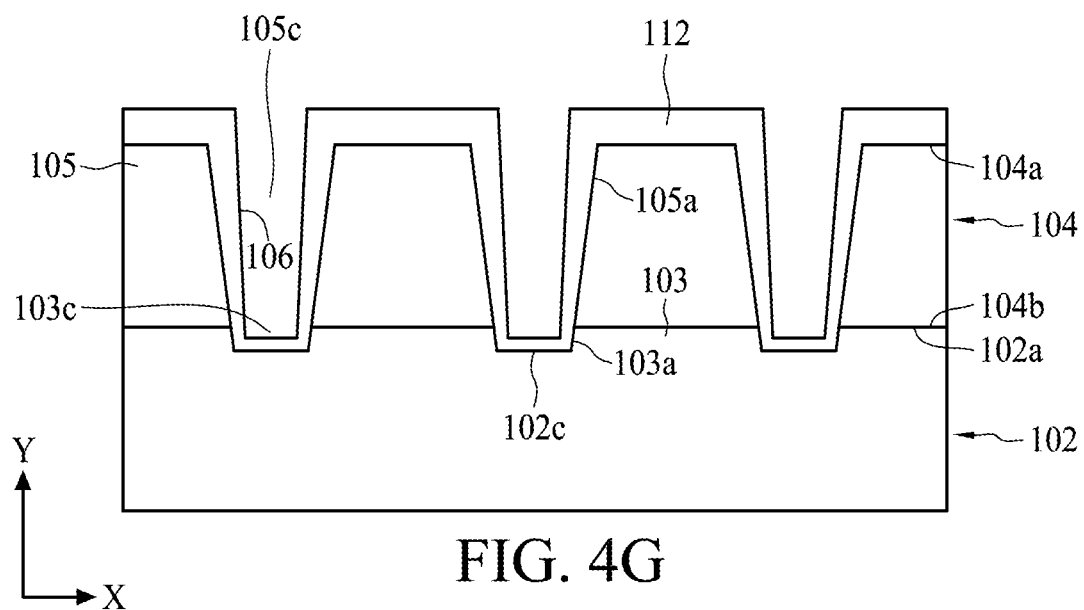

In operation 212, a metal layer 112 is formed over the front surface 104a of the dielectric layer 104, the liner 110 over the first sidewall 103a of the protrusions 103 and the second sidewall 105a of the block 105, and the upper surface 102c of the semiconductor substrate 102, as shown in FIG. 4F and FIG. 4G. In some embodiments, the metal layer 112 is selected from titanium, cobalt, and nickel.

In some embodiments, a thickness of the metal layer 112 disposed over the first sidewall 103a of the protrusions 103 and the second sidewall 105a of the block 105 is consistent along the vertical direction Y, and a thickness of the metal layer 112 disposed over the upper surface 102c of the semiconductor substrate 102 is substantially same as the thickness of the metal layer 112 disposed over the first sidewall 103a of the protrusions 103 or the second sidewall 105a of the block 105, as shown in FIG. 4F. In some embodiments, a ratio of the thickness of the metal layer 112 disposed over the first sidewall 103a of the protrusion 103 and the second sidewall 105a of the block 105 to the thickness of the bottom surface 102c of the semiconductor substrate 102 is 1:1.

In some embodiments, the thickness of the metal 112 layer over the second sidewall 105a of the block 105 and the first sidewall 103a of the protrusions 103 is gradually decreased from the front surface 104a of the dielectric layer 104 towards the upper surface 102c of the semiconductor substrate 102, as shown in FIG. 4G. More particularly, the thickness of the metal layer 112 disposed over the second sidewall 105a of the block 105 is substantially greater than the thickness of the metal layer 112 disposed over the first sidewall 103a of the protrusion 103, the thickness of the metal layer 112 disposed over the second sidewall 105a is gradually decreased from the front surface 104a towards the back surface 104b of the dielectric layer 104, and the thickness of the metal layer 112 disposed over the first sidewall 103a is gradually decreased from the first surface 102a towards the second surface 102b of the semiconductor substrate 102; while the thickness of the upper surface 102c of the semiconductor substrate 102 is substantially less than the thickness of the metal layer 112 disposed over the first sidewall 103a of the protrusion 103. In some embodiments, the thickness of the metal layer 112 disposed over the upper surface 102c of the semiconductor substrate 102 is consistent along a horizontal direction X.

In some embodiments, the ratio of the thickness of the metal layer 112 disposed over the first sidewall 103a of the protrusions 103 and the second sidewall 105a of the block 105 to the thickness of the upper surface 102c is substantially same as or less than 10:1.

In some embodiments, the thickness of the metal layer 112 disposed over the front surface 104a of the dielectric layer 104 is substantially greater than the thickness of the metal layer 112 disposed over the upper surface 102c of the semiconductor substrate 102. In some embodiments, a ratio of the thickness of the metal layer 112 disposed over the front surface 104a of the dielectric layer 104 to the thickness of the upper surface 102c of the semiconductor substrate 102 is substantially same as or less than 100:1. In some embodiments, the ratio of the thickness of the metal layer 112 disposed over the front surface 104a of the dielectric layer 104 to the thickness of the upper surface 102c of the semiconductor substrate 102 is substantially same as or greater than 1:1.

Figure 4H:
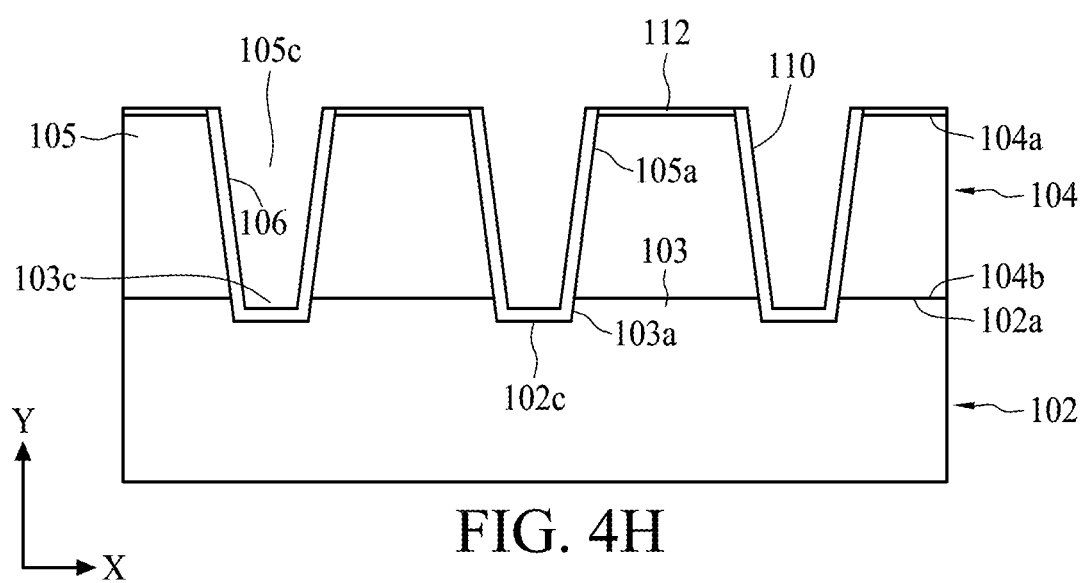

In operation 214, after the deposition of the metal layer 112, a thermal process is performed to at least make a portion of the metal layer 112 react with the liner 110 and the semiconductor substrate 102 to form a silicide layer 106 as shown in FIG. 4H. In some embodiments, the thermal processing utilized to form the silicide layer 106 is preferably rapid thermal processing (RTP). In some embodiments, the silicide 106 disposed over the first sidewall 103a of the protrusion 103 and the second sidewall 105a of the dielectric layer 104 is formed by reacting the metal layer 112 with the liner 110, while the silicide 106 disposed over the upper surface 102a of the semiconductor substrate 102 is formed by reacting the metal layer 112 with the semiconductor substrate 102. In some embodiments, a crystal phase of the silicide layer 106 disposed over the upper surface 102c of the semiconductor substrate 102 is substantially same as a crystal phase of the silicide layer 106 disposed over the first sidewall 103a of the protrusions 103 and the second sidewall 105a of the dielectric layer 104. In some embodiments, a bottom surface 106a of the silicide layer 106 interfaced with the semiconductor substrate 102 is lower than the first surface 102a of the semiconductor substrate 102 interfaced with the dielectric layer 104.

In some embodiments, the thickness of the silicide layer 106 disposed over the first sidewall 103a and the second sidewall 105a is consistent along the vertical direction Y, since the thickness of the metal layer 112 disposed over the first sidewall 103a and the second sidewall 105a is consistent along the vertical direction Y. In some embodiments, the thickness of the silicide layer 106 over the second sidewall 105a of the block 105 and the first sidewall 103a of the protrusion 103 is gradually decreased from the front surface 104a of the dielectric layer 104 towards the upper surface 102c of the semiconductor substrate 102. In some embodiments, the silicide layer 106 is titanium silicide, cobalt silicide, or nickel silicide.

Figure 4I:
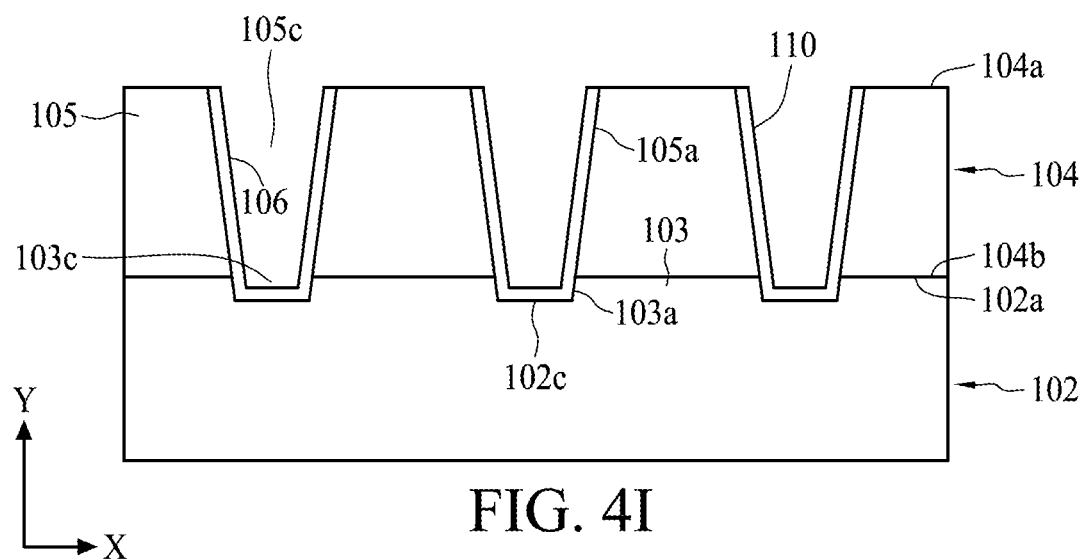

In operation 216, after forming the silicide layer 106, an unreacted portion of the metal layer 112 disposed over the front surface 104a of the dielectric layer 104 is removed as shown in FIG. 4I. In some embodiments, the unreacted portion of the metal layer 112 disposed over the front surface 104a of the dielectric layer 104 is removed by any writable operations such as stripping, etching, polishing, etc. In some embodiments, the unreacted portion of the metal layer 112 disposed over the front surface 104a is completely removed while the silicide layer 106 disposed over the first sidewall 103a of the protrusion 103 and the second sidewall 105a of the block 105 remain in place.

One aspect of the present disclosure provides a method for manufacturing a semiconductor structure. The method comprises providing a semiconductor substrate having a plurality of protrusions; disposing a dielectric layer over the protrusions; disposing a liner over a first sidewall of the protrusions and a second sidewall of the dielectric layer; disposing a metal layer over the liner and the semiconductor substrate neighboring the protrusions; and performing a thermal process to at least make a portion of the metal layer react with the liner and the semiconductor substrate to form a silicide layer.

One aspect of the present disclosure provides a semiconductor structure. The semiconductor substrate comprises a semiconductor substrate, a dielectric layer, and silicide layer. The semiconductor substrate has a plurality of protrusions. The dielectric layer is disposed over the semiconductor substrate and has a plurality of blocks disposed over the protrusions. The silicide layer is disposed over a first sidewall of the protrusions, a second sidewall of the blocks, and an upper surface of the semiconductor substrate adjacent to the first sidewall, and a bottom surface of the silicide layer is lower than a first surface of the semiconductor substrate.

Another aspect of the present disclosure provides a method for manufacturing a semiconductor structure. The method comprises providing a semiconductor substrate having a plurality of protrusions; disposing a dielectric layer having a plurality of blocks over the protrusions, respectively; disposing a liner over a first sidewall of the protrusions and a second sidewall of the blocks; disposing a metal layer over the liner, a front surface of the dielectric layer and an upper surface of the semiconductor substrate; performing a thermal process to at least make a portion of the metal layer react with the liner and the semiconductor substrate to form a silicide layer; and performing a wet etch process to remove an unreacted portion of the metal layer over a front surface of the dielectric layer.

Another aspect of the present disclosure provides a method for manufacturing a semiconductor structure. The method comprises providing a semiconductor substrate; disposing a dielectric layer over the semiconductor substrate; forming a plurality of recesses in the semiconductor substrate and a plurality of through holes in the dielectric layer, wherein the through holes are in communication with the recesses, respectively; disposing a liner over the semiconductor substrate exposed by the recesses and the dielectric layer exposed by the through holes; removing a portion of the liner disposed over a front surface of the dielectric layer; disposing a metal layer over the liner, a front surface of the dielectric layer and the upper surface of the semiconductor substrate; and performing a thermal process to make the metal layer react with the liner and the semiconductor substrate to form a silicide layer; and performing a wet etch process to remove an unreacted portion of the metal layer over a front surface of the dielectric layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a semiconductor substrate having a plurality of protrusions;
   a dielectric layer disposed over the semiconductor substrate, the dielectric layer having a plurality of blocks disposed over the protrusions; and
   a silicide layer disposed over a first sidewall of the protrusions, a second sidewall of the blocks, and an upper surface of the semiconductor substrate adjacent to the first sidewall;
   wherein a bottom surface of the silicide layer is lower than a first surface of the semiconductor substrate.

2. The semiconductor structure of claim 1, wherein the protrusion has a first bottom width and a first upper width less than the first bottom width, the blocks have a second bottom width and a second upper width less than the second bottom width.

3. The semiconductor structure of claim 2, wherein a slope of the first sidewall and the second sidewall is consistent along a vertical direction.

4. The semiconductor structure of claim 1, wherein the protrusions and the blocks disposed over the protrusions are arranged in a funnel configuration.

5. The semiconductor structure of claim 1, wherein a thickness of the silicide layer disposed over the first sidewall and the second sidewall is substantially same as a thickness of the silicide disposed over the upper surface.

6. The semiconductor structure of claim 1, wherein a thickness of the silicide layer disposed over the first sidewall and the second sidewall is substantially greater than a thickness of the silicide disposed over the upper surface.

7. The semiconductor structure of claim 1, wherein a ratio of a thickness of the silicide layer disposed over the first sidewall and the second sidewall to a thickness of the upper surface is substantially same as or less than 10:1.

8. The semiconductor structure of claim 7, wherein the ratio of the thickness of the silicide layer disposed over the first sidewall and the second sidewall to the thickness of the upper surface is substantially same as or greater than 1:10.

9. The semiconductor structure of claim 8, wherein the thickness of the silicide layer over the first sidewall and the second sidewall is gradually decreased from a front surface of the dielectric layer towards the upper surface.

10. The semiconductor structure of claim 1, wherein a crystal phase of the silicide layer disposed over the upper surface is substantially same as a crystal phase of the silicide layer disposed over the first sidewall and the second sidewall.

11. A method for manufacturing a semiconductor structure, comprising steps of:
providing a semiconductor substrate having a plurality of protrusions;
disposing a dielectric layer having a plurality of blocks over the protrusions, respectively;
disposing a liner over a first sidewall of the protrusions and a second sidewall of the blocks;
disposing a metal layer over the liner, a front surface of the dielectric layer and an upper surface of the semiconductor substrate;
performing a thermal process to at least make a portion of the metal layer react with the liner and the semiconductor substrate to form a silicide layer; and
performing a wet etch process to remove an unreacted portion of the metal layer over a front surface of the dielectric layer.

12. The method of claim 11, wherein disposing the liner over the first sidewall of the protrusions and the second sidewall of the blocks comprises:
disposing the liner over a front surface of the dielectric layer away from the semiconductor substrate, the first sidewall, the second sidewall, and an upper surface of the semiconductor substrate adjacent to the first sidewall; and
removing the liner over the front surface and the upper surface by etching.

13. The method of claim 11, wherein a thickness of the liner disposed over the first sidewall and the second sidewall is consistent along a vertical direction.

14. The method of claim 11, wherein the metal layer is further disposed over a front surface of the dielectric layer, and the unreacted portion of the metal layer over the front surface is removed after performing the thermal process.

15. The method of claim 14, wherein a ratio of a thickness of the metal layer disposed over the front surface to a thickness of the upper surface is substantially same as or less than 100:1.

16. The method of claim 15, wherein the ratio of the thickness of the metal layer disposed over the front surface to the thickness of the upper surface is substantially same as or greater than 1:1.

17. The method of claim 11, wherein a thickness of the metal layer disposed over the first sidewall and the second sidewall is consistent along a vertical direction.

18. The method of claim 11, wherein a thickness of the metal layer disposed over the first sidewall and the second sidewall is gradually decreased from a front surface of the dielectric layer away from the semiconductor substrate towards the upper surface.

19. The method of claim 11, wherein a bottom surface of the silicide layer interfaced with the semiconductor substrate is lower than a first surface of the semiconductor substrate interfaced with the dielectric layer.

20. A method for manufacturing a semiconductor structure, comprising steps of:
providing a semiconductor substrate;
disposing a dielectric layer over the semiconductor substrate;
forming a plurality of recesses in the semiconductor substrate and a plurality of through holes in the dielectric layer, wherein the through holes are in communication with the recesses, respectively;
disposing a liner over the semiconductor substrate exposed by the recesses and the dielectric layer exposed by the through holes;
removing the liner disposed over an upper surface exposed by the recesses of the semiconductor substrate;
removing a portion of the liner disposed over a front surface of the dielectric layer;
disposing a metal layer over the liner, a front surface of the dielectric layer and the upper surface of the semiconductor substrate;
performing a thermal process to make the metal layer react with the liner and the semiconductor substrate to form a silicide layer; and
performing a wet etch process to remove an unreacted portion of the metal layer over a front surface of the dielectric layer.

* * * * *